United States Patent [19]

Ackerman

[11] Patent Number: 4,500,032

[45] Date of Patent: Feb. 19, 1985

[54] METHOD AND APPARATUS FOR PROPER REGISTRATION OF MATING PARTS

[75] Inventor: Daniel W. Ackerman, Chenango Bridge, N.Y.

[73] Assignee: Universal Instruments Corporation, Binghamton, N.Y.

[21] Appl. No.: 467,082

[22] Filed: Feb. 16, 1983

[51] Int. Cl.³ .......................................... H01L 21/98
[52] U.S. Cl. .............................. 228/180 A; 228/6 A; 228/49 R; 228/5.1; 414/780; 198/345; 140/147
[58] Field of Search ................... 228/5.1, 6 A, 49 R, 228/180 R, 180 A; 140/105, 147; 901/45; 414/780, 781; 198/345

[56] References Cited

U.S. PATENT DOCUMENTS

| | | |
|---|---|---|
| 2,696,746 | 12/1954 | Hoffman et al. ............. 140/147 X |
| 3,559,279 | 2/1971 | Miklaszewski ................ 228/49 R |
| 3,687,172 | 8/1972 | Suverkropp ................... 140/147 |
| 3,946,931 | 3/1976 | Bahnek et al. ............... 228/180 A |
| 4,215,469 | 8/1980 | Asai et al. ................... 29/741 X |
| 4,434,550 | 3/1984 | Wilke et al. ................. 29/741 X |

Primary Examiner—Kenneth J. Ramsey
Attorney, Agent, or Firm—Fidelman, Wolffe & Waldron

[57] ABSTRACT

The invention is directed to a method and apparatus for handling a component having a body and one or more members protruding therefrom, such that the protruding members are put in proper, mating registration with corresponding holes of a substrate or the like. The components are handled during transport and insertion by gripping of the bodies thereof, and the method and apparatus of the invention compensates for any offset in X, Y, and θ between the profile of the body and a particular pattern or location of the protruding members relative to the profile of the body.

21 Claims, 12 Drawing Figures

METHOD AND APPARATUS FOR PROPER REGISTRATION OF MATING PARTS

CROSS-REFERENCES TO PRIOR ART

U.S. Pat. No. 2,870,728—THREE DIMENSIONAL ALIGNING APPARATUS FOR ELECTRONIC COMPONENTS, J. R. Goodykoontz, Jr., issued Jan. 27, 1959

U.S. Pat. No. 3,515,877—ELECTRO-OPTICAL POSITIONER, D. W. Baxter, et al., issued June 2, 1970

U.S. Pat. No. 3,581,375—METHOD AND APPARATUS FOR MANUFACTURING INTEGRATED CIRCUITS, H. R. Rottmann, issued June 1, 1971

U.S. Pat. No. 3,698,620—APPARATUS FOR CONNECTING LEAD PORTIONS OF A LEAD FRAME TO RESPECTIVE PADS ON A CHIP, Harry J. Geyer, et al., issued Oct. 17, 1972

U.S. Pat. No. 3,893,217—SYSTEM AND METHOD FOR AUTOMATIC INSERTION OF PINS IN HOLES, James J. Edmond, issued July 8, 1975

U.S. Pat. No. 3,984,006—AUTOMATIC ASSEMBLY CONTROL SYSTEM, Kiyoo Takeyasu, et al., issued Oct. 5, 1976

U.S. Pat. No. 4,222,036—PROCESS FOR ASSEMBLY OF COMPONENTS ON PRINTED CARDS WITH THE USE OF A POSITION-LOCATING AID, Theodor Troukens, issued Sept. 9, 1980

U.S. Pat. No. 4,243,923—SERVO-CONTROLLED MOBILITY DEVICE, Daniel E. Whitney, et al., issued Jan. 6, 1981

U.S. Pat. No. 4,342,090—BATCH CHIP PLACEMENT SYSTEM, George A. Caccoma, et al., issued July 27, 1982

BACKGROUND AND SUMMARY OF THE INVENTION

The invention is in the field of handling articles having bodies and members protruding therefrom, particularly such articles as electronic components having bodies and depending leads. During the manufacture of such electronic components, a particular pattern of one or more leads is known, and spacing tolerances between leads of a particular pattern are exact enough for insertion into a corresponding hole pattern of a circuit board. However, during attachment of the component body to the leads by soldering or the like, and during subsequent treating of the body after such lead attachment, such as encasing the body with a protective cover, irregularities can and do occur such that the body profile may become offset relative to the lead pattern in X, Y, $\theta$ or combinations thereof and result in a variation of the orientation and location of the lead pattern relative to the profile of the body. Such variation may occur between batches of components or from component to component in a particular batch. Such an offset between the body profile and the lead pattern presents problems in proper insertion of the leads into a corresponding pattern of circuit board holes during subsequent handling of the component.

With some types of components, such irregularities are overcome by engaging the component body with a vacuum tube and manipulating the vacuum tube to align the leads of the component with corresponding substrate holes according to an optics system or the like. Other types of components have bodies which do not lend themselves to handling by such a vacuum tube, so that, heretofore, they had to be manually oriented and inserted.

What is needed is a method and apparatus by which a great variety of components, particularly those having an offset between their lead pattern and their body profile and those having irregular body surfaces that do not lend themselves to vacuum pickup and handling, may be handled by their bodies such that automated compensation of the above-described displacement or offset of the body profile relative to the lead pattern is accomplished.

For purposes of disclosing and claiming this invention, a "nominal" pattern is one in which there is no relative offset of the body profile from a defined pattern; and an "actual" pattern is one in which there may or may not be such a relative offset. Hence, an offset of the "actual" lead pattern of a component from the "nominal" lead pattern which that component should have can be said to include the above-described irregularities. Further, the pattern need not be one of leads extending from the body. Rather, it may be a pattern of recesses or holes in the body which are to be mated with protruding members of another body. Additionally, a first body may have a mixed pattern of holes and leads for mating with a corresponding mixed pattern of holes and leads of a second body.

The above cross-referenced prior art is representative of the state-of-the-art alignment and orientation methods and devices presently available in automated or robotic component handling. As will be appreciated from the following disclosure, none of these references suggest or contemplate a solution to the problem of handling components in which the body and lead pattern are offset relative to each other and in which the components are handled by the bodies thereof such that proper orientation of the lead pattern relative to a corresponding hole pattern may be effected during a physical gripping of the component body.

Accordingly, it is an object of the instant invention to provide a method and apparatus for handling components having a body and leads depending therefrom in which the component may be gripped by the body for transport and in which a relative offset between a lead or hole pattern and the body profile may be compensated for during handling and mating of the pattern with a corresponding pattern in another body or substrate.

It is a further object of the invention to provide a method and apparatus for straightening leads of electronic components or the like during such compensating and prior to inserting the leads into their corresponding circuit board holes.

It is a further object of this invention to handle components which, because of irregular surface configurations, are not easily handled by vacuum pickup and transfer devices, while providing compensation for any relative offset between a lead pattern and body profile and providing the necessary accuracy for insertion of the leads into the holes of a corresponding hole pattern of a substrate.

In one embodiment of the invention, a component handling device is mountable upon known X, Y, Z-translatable robot arms or the like and provides "wrist" manipulation such that the device may assume various pick-up and insertion attitudes. The device has a gripper assembly which is "floatable" within a head assembly such that a component may be oriented according to the lead pattern for subsequent insertion into a corresponding hole pattern without regard to X, Y, and θ offsets of the lead pattern relative to the component body.

DETAILED DESCRIPTION OF THE INVENTION

Figure 12:
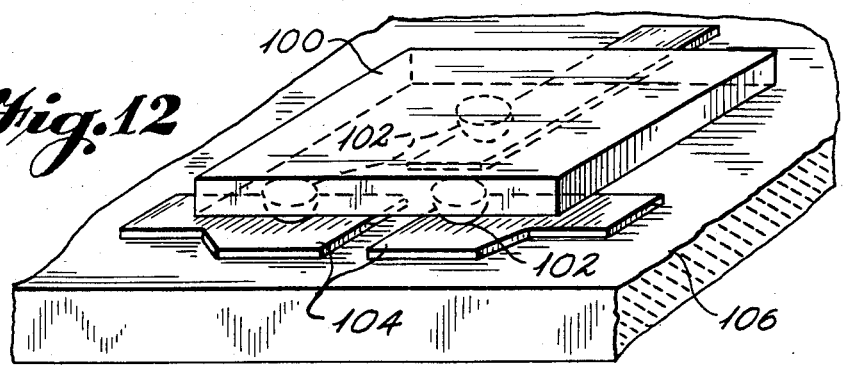
FIG. 12 is an isometric view illustrating connection of an electrical component to the pads of a circuit board by means of solder bumps.
Figure 7:
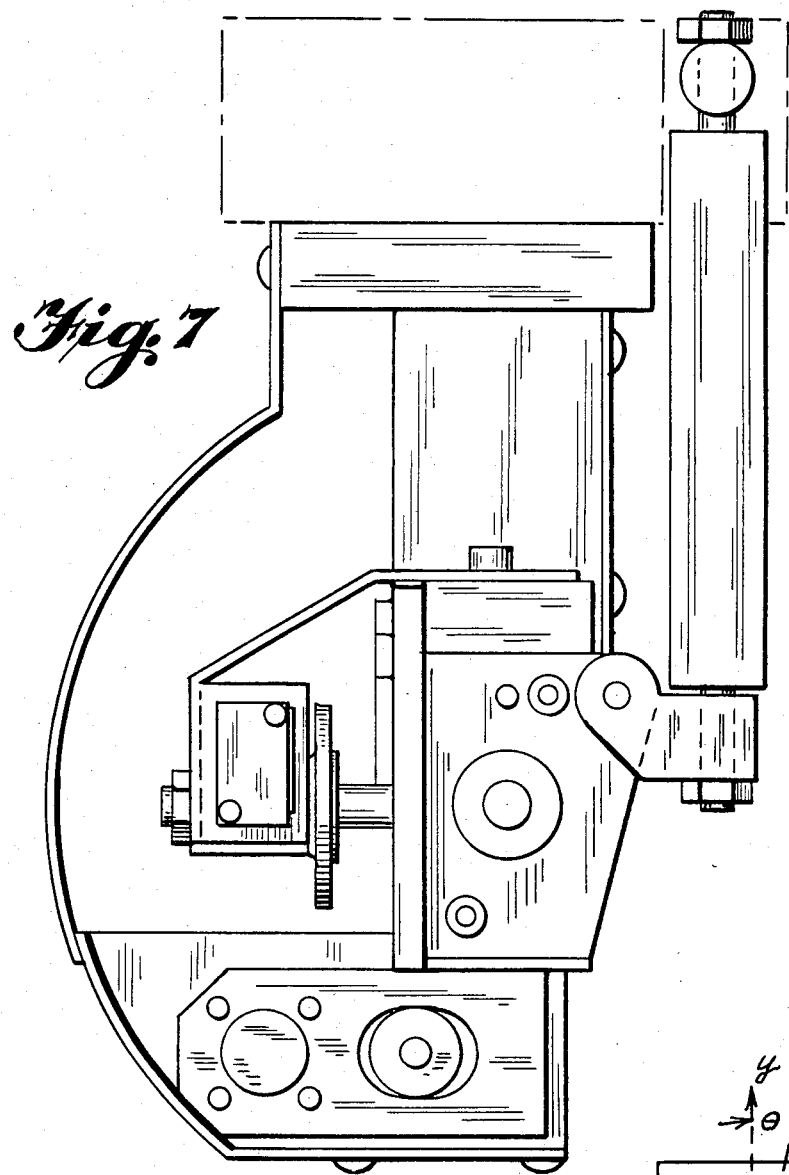
FIG. 7 is a right side elevation of the device of FIG. 3.
Figure 8:
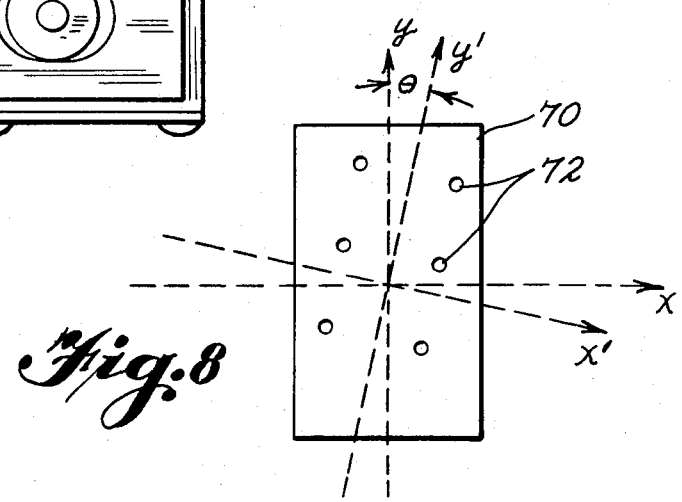
FIG. 8 schematically illustrates a component having a lead pattern which is offset in Y and θ.

FIG. 8 schematically illustrates an exaggerated offset of a component body 70 from a lead pattern comprising leads 72. As can be seen from this Figure, the lead pattern is offset in θ and Y relative to the profile of body 70. FIG. 12 illustrates a component mounting arrangement in which an electrical component 100 has one or more solder bumps 102 depending therefrom in order to provide electrical and mechanical connection of the component to corresponding conductive pads 104 of circuit board 106 via solder bumps 102. As with components having wire leads, the actual pattern of solder bumps 102 may be offset in θ, X, and Y relative to a nominal pattern thereof.

Figure 9:
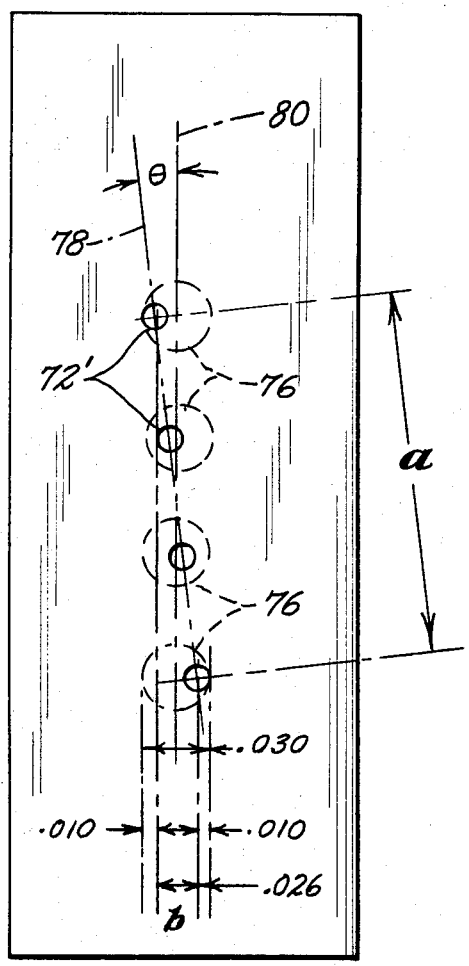
FIG. 9 schematically illustrates a component having a lead pattern offset in θ, and a corresponding hole pattern indicated in phantom.

The problems associated in handling components having such offsets may be better appreciated by reference to FIG. 9, in which leads 72' comprise a row-type lead pattern having axis 78 for insertion into holes 76 having a corresponding row-type hole pattern axis 80. As can be seen from FIG. 9, lead pattern axis 78 is offset relative to the profile of component 70' and to hole pattern axis 80 by an amount θ. Typical parameters for the illustration of FIG. 9 are: lead diameter=0.020 inches; hole diameter=0.030 inches; a=0.750 inches; and θ=2°. Accordingly, dimension b is a projected distance between the centers of the end leads of the lead pattern and is equal to 0.026 inches. This distance, plus the additional 0.010 inches (half of a lead diameter) added to each end of dimension b, equals 0.046 inches and would allow all of the leads 72' of the lead pattern to just clear the holes 76 of the hole pattern if the hole diameters were 0.050 inches. Since typical tolerances for alignment of the leads of a particular pattern are ±0.003 inches from axis 78, a "worst case" analysis would indicate that the two end leads of the row would require even larger hole diameters when each of these leads has been offset from axis 78 by the maximum tolerance of 0.003 inches. Of course, if θ is greater than 2° in the illustration of FIG. 9, leads 72 would not clear the edges of 0.050" holes even when all of the leads 72 are exactly centered upon axis 78. Additionally, as is often the case, the problem may be compounded by a shifting of the lead pattern along or perpendicular to axis 78. Such offsets can and do cause particular problems in high speed, automated insertion machines, wherein a head assembly is programmed to pick up a component at a particular location and to deliver that component to an insert position and insert the leads thereof into corresponding holes of a substrate such as a printed circuit board. As will be appreciated, numerous misinsertions will occur over an extended period of time in such automated machines. Thus, the solution to this assembly task has been the slow, tedious hand insertion of such offset components.

Figure 1:
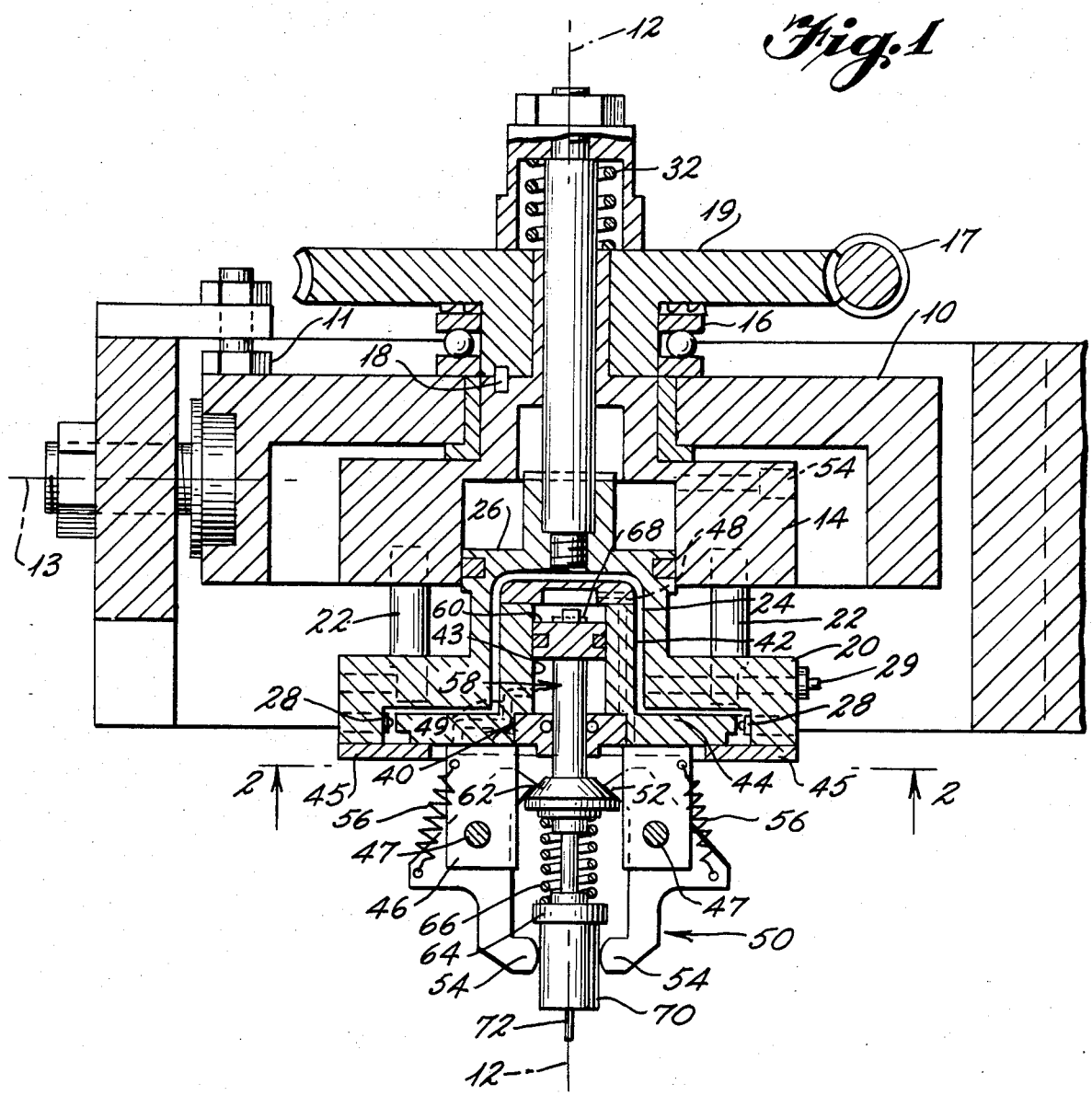
FIG. 1 schematically illustrates, in cross-section, a side view of a device of the instant invention.
Figure 2:
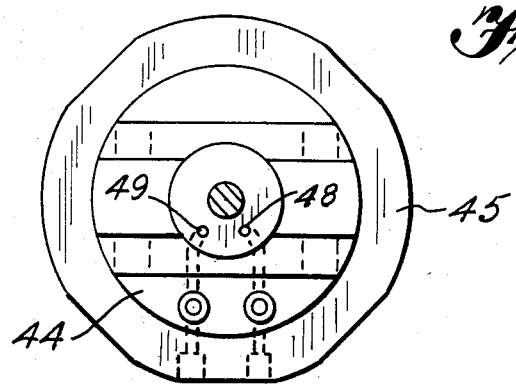
FIG. 2 is a schematic cross-section, as viewed approximately along arrows 2—2 of FIG. 1.
Figure 3:
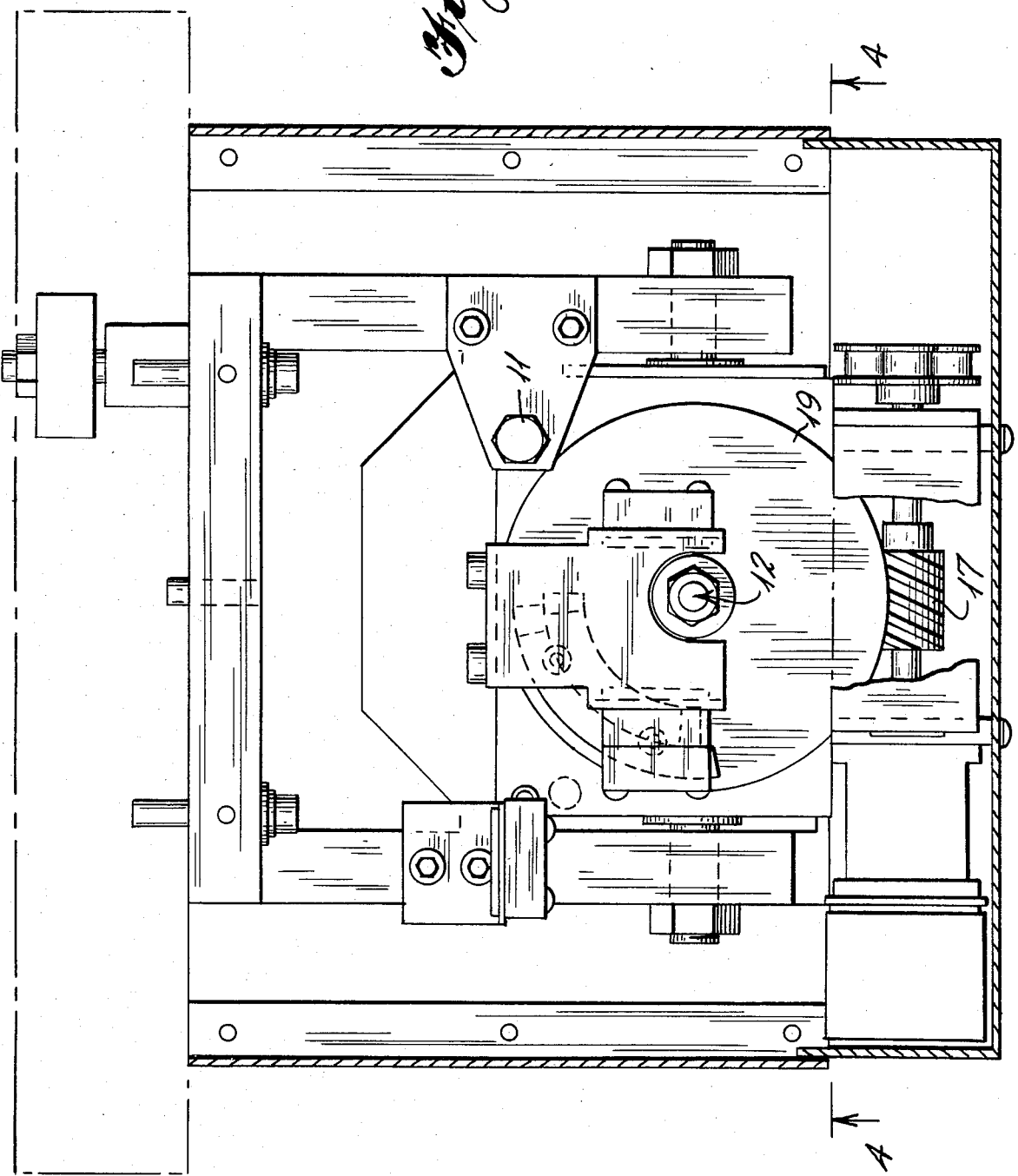
FIG. 3 is a detailed, top plan view of a device of the instant invention, with portions thereof broken away.
Figure 4:
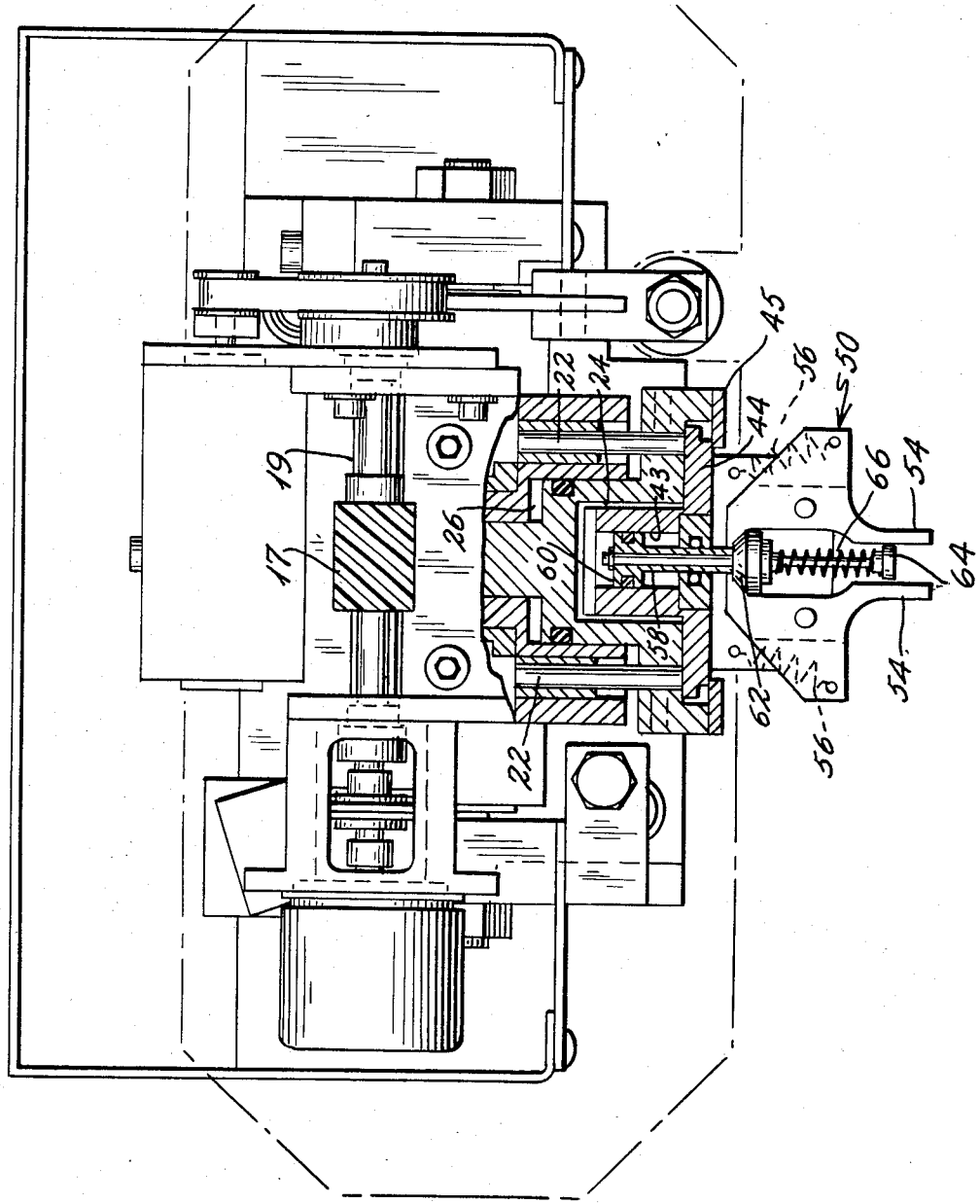
FIG. 4 is a front view, partially in section, as viewed approximately along the arrows 3—3 of FIG. 3.
Figure 5:
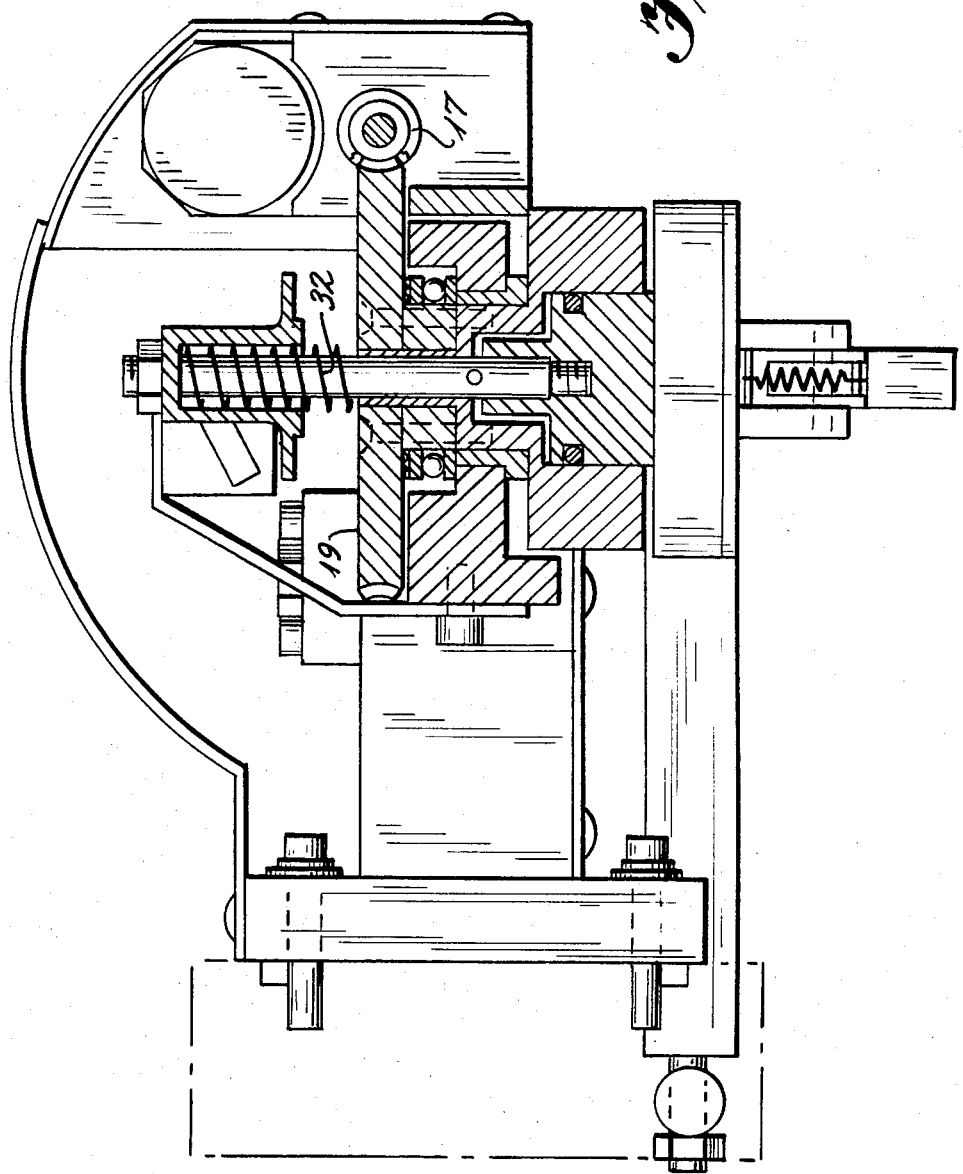
FIG. 5 is a left side, cross-sectional view of the device of FIG. 4.
Figure 6:
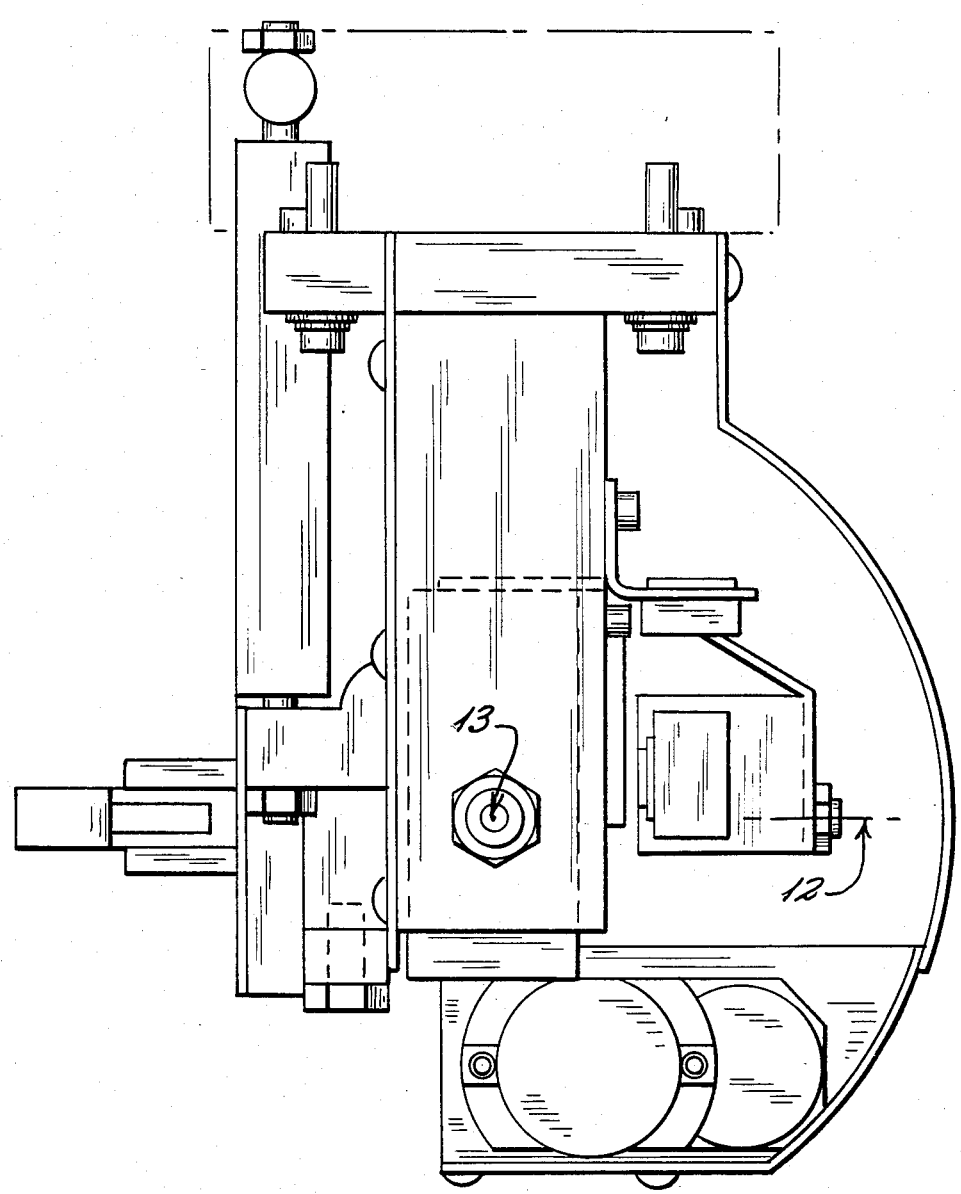
FIG. 6 is a left side elevation of the device of FIG. 3.

In order to overcome these misinsertion problems associated with automated assembly, the reader's attention is directed to FIG. 1 which discloses a translation assembly attachable to any number of well-known X, Y, Z-manipulatable robot arms, and which is further manipulatable about axes 12 and 13 in order to provide a "wrist" action. The device of FIG. 1 is illustrated in more detail in FIGS. 3-7, from which it may be seen that housing 10 is pivotal about axes 13 with adjustment for a stop position being provided by machine screw 11. Mounted in housing 10 for rotation about axes 12 is cylinder 14 having fluid inlet/outlet 15 for communication with the interior thereof. Cylinder 14 is keyed to a worm gear 19 by means of key 18 such that rotation of worm 17 will rotate worm gear 19 which, in turn, rotates cylinder 14. Bearing 16 allows relative rotation between gear 19 and housing 10. Received within cylinder 14 is piston portion 26 of head assembly 20. Keys 22 prevent rotation of head assembly 20 about axis 12 relative to cylinder 14, such that head assembly 20 is extensible from cylinder 14 by applying fluid through opening 15, and is retractable by means of spring 32. Head assembly 20 is a combined piston and air chamber, comprising the above-mentioned piston portion 26 and air chamber 24 having fluid passage 29. Gripper assembly 40 has upper portion 42 and flange portion 44 such that gripper assembly 40 is "floatable" for movement in X, Y, and θ of a coordinate system within a plane perpendicular to axes 12 and defined by bearing plate 45. Having achieved such movement of gripper assembly 40 relative to head assembly 20, fluid pressure may be applied through inlet 29 in order to lock of fix gripper assembly 40 relative to head assembly 20 by forcing flange 44 against bearing plate 45. Compression springs 28 provide for recentering of gripper assembly 40 about axis 12 upon removal of fluid pressure from air chamber 24. Such centering springs are omittable from the device, but do find application in preventing "bottoming out" of gripper assembly 40 relative to head assembly 20, i.e., when housing 10 is rotated 90° about axes 13 from the position shown in FIG. 1.

Depending from flange 44 of gripper assembly 40 are gripper brackets 46 which support grippers 50 for pivoting about pivot axes 47. Grippers 50 have portions 54 for gripping the body of a component 70 and are normally biased to an open position by means of tension springs 56. In order to close gripper portions 54 upon body 70 of a component, gripper assembly 40 is further provided with a cylinder portion 43, within which is received a gripper actuator 58 comprising piston portion 60 and actuator cam 62. Gripper actuator 58 is stroked by means of fluid application and evacuation via fluid inlets 48 and 49. Grippers 50 have cam portions 52 engageable by actuator cam 62, when gripper actuator 58 is retracted, such that grippers 50 pivot above axes 47 and gripper portions 54 securely grip the body 70 of a component. Telescopic within gripper actuator 58 is a pusher 64 biased to an extended position by compression spring 66 and limited in its extension by ring 68. The function of pusher 64 will be better appreciated from the following description of the operation of the device.

OPERATION OF THE PREFERRED EMBODIMENT

Figure 10:
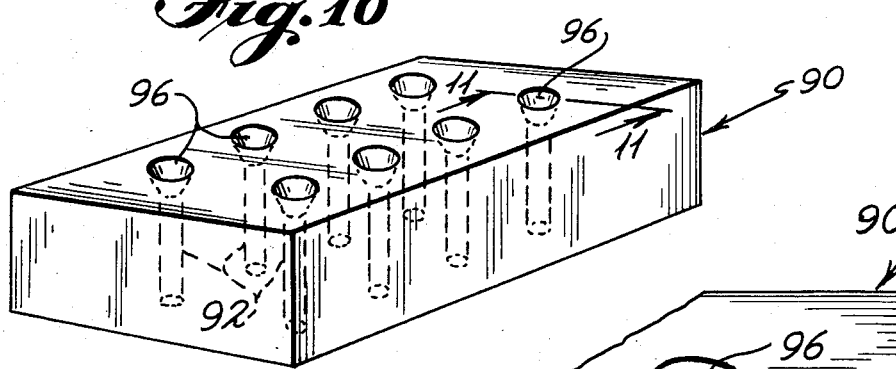
FIG. 10 is an isometric view of one embodiment of a lead gauging, guiding, and straightening device.
Figure 11:
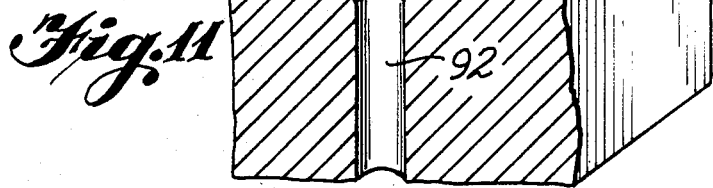
FIG. 11 is an enlarged view, approximately along the arrows 11—11 of FIG. 10, to illustrate the guiding feature of the gauging device of FIG. 10.

Assuming that a component whose body profile is offset relative to a lead pattern is to be mounted onto a circuit board by insertion of the leads into corresponding holes of the circuit board, a robotic arm or the like transports the device of FIG. 1 to a component pick-up station at which the device is oriented and actuated to grip the body 70 of the component by grippers 50. At this time, gripper assembly 40 may be fixed or floating relative to head assembly 20. Having gripped the component, the device of FIG. 1 is moved to a gauging station. At this gauging station, a gauge 90 having gauge holes 92 (FIG. 10) is located and is useable with either of the lead patterns illustrated in FIGS. 8 and 9. Additionally, gauge 90 is oriented and located such that, upon mating of the leads of a component with the appropriate holes of gauge 90, standard robotic or automated insertion machine controls, i.e., numerical control, may be used to transfer the component to a position above and in alignment with a corresponding hole pattern of a circuit board. Holes 92 of gauge 90 are provided with inverted conical depressions 96 having a sufficient conical base opening to receive the leads of a component whose actual lead pattern is offset from a nominal lead pattern during manufacture of the component. Further, those components which do not have such an offset often have one or more leads which are slightly bent away from their intended longitudinal axes. With such bent leads, lead-in portion 96 of holes 92 will facilitate straightening of bent leads upon insertion into holes 92.

Having transferred the component to a position slightly above the gauging station, gripper fingers 54 are released from engagement with component 70 and the leads of the component are inserted into holes 92 of gauge 90 under the influence of guiding portions 96 and spring biased pusher 64. In this manner, the lead pattern is exactly located relative to the position programmable head assembly 20, whereas the body, which is offset relative to the lead pattern, is not. At this time, with gripper assembly 40 floatable within head assembly 20 and grippers 50 open for reception of the component body, head assembly 20 is lowered and grippers 50 are actuated to cause gripper portions 54 to engage the body 70 and, thus, to cause gripper assembly 44 to float relative to head assembly 20. Although only two grippers 50 are illustrated in the drawings, it is contemplated that three or more fingers, located in different orientations about axes 12, could be mounted on gripper assembly 40, according to various profiles of the bodies to be handled by the device. Having "floated" gripper assembly 40 in X, Y, $\theta$ or combinations thereof, fluid is applied to chamber portion 24 of head assembly 20 to lock gripper assembly 40 relative to head assembly 20. Having provided the proper orientation of the lead pattern of the component relative to head assembly 20, the component is then picked up from gauge 90 and transferred a programmed distance for insertion of the leads into a corresponding hole pattern.

Although operation of the device, in the above description, included a gauging station separate from the pick-up and insertion stations, it is contemplated that other means for gauging or orienting the lead pattern of components may be used. For instance, when components are selectable from a plurality of supply stations, there may be other gauge means for exactly locating the orientation of the lead pattern without regard to the body profile such that all that is required is that the head assembly 20 and floatable gripper assembly 40 are engaged with the body of the component while gripper assembly 40 is floating. Thereafter, gripper assembly 40 will be locked or fixed relative to head assembly 20 and the component will be transported to the insertion position.

The important thing to realize is that, in automated component insertion or other processing of the component, the particular location of the hole pattern is programmable as well as the particular location of pickup of the component. However, it is often the case that the body profile is offset relative to the lead pattern of a particular component, a situation which is not readily programmable. Further, the bodies of some components are not easily adaptable to vacuum pickup.

Throughout the description of the preferred embodiment of the invention, reference has been made to electronic components having bodies and leads depending therefrom. However, it should be appreciated that the concept of the invention includes handling other types of components, such as transformer bodies having mounting posts depending therefrom. Further, the description of the preferred embodiment has included handling of components having multiple leads, whereas it should be appreciated that a device having only one depending member offset from a nominal location relative to the body profile could present the same type of problems which are remedial by the instant invention. Further, it is contemplated that the gauge means could have tapered posts instead of tapered holes, and that the component body could have recesses therein instead of members protruding therefrom, and the same concept of compensating for pattern offsets could be accomplished by the instant invention.

It will thus be seen that the objects set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

Now that the invention has been described, what is claimed as new and desired to be secured by Letters Patent is:

1. A method of automated compensating for misalignment of a surface profile of a first body from a pattern on a bottom of said first body and mating said first body pattern within a specified tolerance, with a corresponding pattern on a top of a second body, said method comprising the steps of:

provding a gage pattern in spaced relation from and having the same orientation as said second body pattern;

engaging and gripping said first body at a first station by clamping at least a portion of said surface in a gripper assembly of a translatable head assembly; said gripper assembly being floatable relative to said head assembly within a floatation plane;

translating said head assembly, after attaining said gripping, from said first station to a second station having said gage pattern;

engaging and guiding said first body pattern with said gage pattern, and mating said first body and gage patterns within said specified tolerance;

fixing said gripper assembly relative to said head assembly in said floatation plane; and disengaging said first body and gage patterns after said fixing, and translating said head assembly and gripped first body to a third station having said second body, and mating said first and second body patterns within said specified tolerance.

2. A method as in claim 1, and further comprising the steps of:

ungripping said first body at said second station prior to said guiding; and regripping said first body by said gripper assembly, after said mating at said second station and prior to said fixing.

3. A method as in claim 2, and further comprising the step of:

seating flush with a gage surface said first body during said mating at said second station, such that said first body is positioned a specifiable distance within said gripper assembly in a direction generally perpendicular to said floatation plane during said fixing.

4. A method as in claim 2, wherein said first body pattern comprises at least one member protruding from said bottom and said second body pattern comprises at least one recess in said second body top, and further comprising the step of:

inserting said protruding member into said recess during said mating according to registration of said patterns.

5. A method as in claim 4, wherein said first body pattern further comprises at least one recess in said first body bottom and said second body pattern further comprises at least one member protruding from said second body top, and further comprising the step of:

inserting said protruding members into said recesses according to registration of said patterns during said mating.

6. A method as in claim 2, wherein said second body comprises at least one recess in said second body top, and said first body pattern comprises at least one member protruding from said first body bottom.

7. A method as in claim 2, wherein said first body pattern comprises at least one solder bump on said bottom and said second body pattern comprises at least one lead connection point on said top, and further comprising the step of:

connecting said solder bump and said lead connection poinnt according to registration of said patterns during said mating.

8. A method as in claim 4, and further comprising the step of:

straightening said protruding member during said guiding.

9. An apparatus to accomplish automated compensating for misalignment of a surface profile of a first body from a pattern on a bottom of said first body and mating said first body pattern, within a specified tolerance, with a corresponding pattern on a top of a second body, said apparatus comprising:

a gage pattern in spaced relation from and having the same orientation as said second body pattern;

means for engaging and gripping said first body at a first station by clamping at least a portion of said surface in a gripper assembly of a translatable head assembly; said gripper assembly being floatable relative to said head assembly within a floatation plane;

means for translating said head assembly, after attaining said gripping, from said first station to a second station having said gage pattern;

means for engaging and guiding said first body pattern with said gage pattern, and for mating said first body and gage patterns within said specified tolerance;

means for fixing said gripper assembly relative to said head assembly in said floatation plane; and means for disengaging said first body and gage patterns after said fixing, and for translating said head assembly and gripped first body to a third station having said second body, and for mating said first and second body patterns, within said specified tolerance.

10. An apparatus as in claim 9, and further comprising:

means for ungripping said first body at said second station prior to said guiding, and for regripping said first body by said gripper assembly after said mating at said second station and prior to said fixing.

11. An apparatus as in claim 10, and further comprising:

means for seating flush with a gage surface said first body bottom during said mating at said second station, such that said first body is positioned a specificable distance within said gripper assembly in a direction generally perpendicular to said floatation plane.

12. An apparatus as in claim 10, wherein said first body pattern comprises at least one member protruding from said bottom and said second body pattern comprises at least one recess in said second body top for receiving said protruding member.

13. An apparatus as in claim 12, wherein said first body pattern further comprises at least one recess in said first body bottom and said second body pattern further comprises at least one member protruding from said second body top.

14. An apparatus as in claim 10, wherein said second body comprises at least one recess in said second body top and said first body pattern comprises at least one member protruding from said first body bottom.

15. An apparatus as in claim 10, wherein said first body pattern comprises at least one solder bump on said bottom and said second body pattern comprises at least one lead connection point on said top.

16. An apparatus as in claim 12, and further comprising:

means for straightening said protruding member during said guiding.

17. An apparatus for automated compensating for an offset between nominal lead patterns and actual lead patterns of components, each of said components comprising a body and at least one lead depending from said body to define said actual lead pattern, to provide for proper mating of component leads into substrate holes defining a hole pattern corresponding to said nominal lead pattern, said offset being defineable in a planar coordinate system by X, Y, $\theta$ and combinations thereof, said apparatus comprising:

a gage comprising at least one gage hole defining a reference pattern having hole axes superimposable with hole axes of said hole pattern, and means for guiding said component leads engaged therewith and mating said actual lead pattern with said reference pattern to effect said offset compensating;

means for transporting said component to said gage means at a first station and engaging said leads with said lead-in means for mating of said actual lead pattern and said reference pattern;

means for gripping said body and removing said component from said gage upon mating of said actual lead pattern and said reference pattern and for retaining said offset compensating; and means for transporting said component to a second station and inserting said leads into said substrate holes while retaining said offset compensating.

18. An apparatus as in claim 17, wherein said transporting means comprises:

a head assembly having an axis; and a gripper assembly floatable and lockable in said head assembly relative to a floatation plane generally perpendicular to said head assembly axis and comprising said gripping means, such that floating of said gripper assembly at said first station upon effecting said compensating, and subsequent locking of said gripper assembly relative to said head assembly, provides said retaining.

19. An apparatus as in claim 18, and further comprising:

means for ungripping said component body at said first station prior to said offset compensating and for regripping said component body at said first station after said offset compensating to effect said retaining.

20. An apparatus as in claim 17, wherein said guiding means comprises:

generally conical-shaped lead-in portions of said gage holes.

21. An apparatus as in claim 17, and further comprising:

means for straightening said leads.

* * * * *